Dec. 18, 1962 K. E. LEWIS 3,069,567

RADIO-FREQUENCY TRANSISTOR GATE APPARATUS

Filed Aug. 30, 1960 3 Sheets-Sheet 1

INVENTOR.
KENNETH E. LEWIS,
BY
Robert H. Himes
ATTORNEY.

RADIO-FREQUENCY TRANSISTOR GATE APPARATUS

Filed Aug. 30, 1960 3 Sheets-Sheet 2

INVENTOR.
KENNETH E. LEWIS,
BY
Robert H. Himes
ATTORNEY.

Dec. 18, 1962 K. E. LEWIS 3,069,567

RADIO-FREQUENCY TRANSISTOR GATE APPARATUS

Filed Aug. 30, 1960 3 Sheets-Sheet 3

INVENTOR.
KENNETH E. LEWIS,
BY
Robert H. Himes
ATTORNEY.

United States Patent Office 3,069,567
Patented Dec. 18, 1962

3,069,567
RADIO-FREQUENCY TRANSISTOR GATE APPARATUS

Kenneth E. Lewis, Anaheim, Calif., assignor to Hughes Aircraft Company, Culver City, Calif., a corporation of Delaware Filed Aug. 30, 1960, Ser. No. 53,003
5 Claims. (Cl. 307—88.5)

This invention relates to a transistor apparatus for electronically switching signals of frequencies from 10 kilocycles to of the order of 80 megacycles.

One present day apparatus for performing this function is composed of a ladder network of inductors connected in series and the respective junctions therebetween shunted to a radio-frequency ground by means of diodes. When the diodes are reverse-biased, they function as small capacitors whereby the ladder network functions as a low-pass filter capable of passing the desired signal. When the diodes are forward-biased, on the other hand, they present a low resistance to the signal resulting in a resistor-inductor ladder network having high attenuation. This diode-inductor apparatus has several disadvantages. By way of example, it is necessary that the numerous coils required be very carefully placed and shielded to prevent coupling therebetween. Also, manufacturers of diodes are generally very reluctant to control both reverse capacitance and forward dynamic impedance in a single diode; the impedance of the equivalent low-pass filter is often not of a level which is desired; and a large number of components is required to fabricate this type of gating apparatus. Lastly, in operation sufficiently large signal levels may swing the reversed biased diodes into conduction and in any event cause variations in capacitance. Severe harmonic distortion of the signal results.

Gating of radio-frequency signals can also be effected by driving vacuum tubes beyond cut-off. In this case, however, several vacuum tube stages are required to achieve attenuations in excess of 100 decibels. In addition, the power consumption and space requirements of this type of apparatus are both disadvantageous.

It is therefore an object of the present invention to provide an improved transistor apparatus for gating alternating-current signals of frequencies from 10 kilocycles to of the order of 80 megacycles.

Another object of the present invention is to provide a radio-frequency gating apparatus having low insertion loss when "on" and a large insertion loss when "off."

Still another object of the present invention is to provide a radio-frequency gating apparatus capable of switching from "on" to "off" in a few microseconds.

A further object of the invention is to provide a radio-frequency gating apparatus which has a comparatively small number of components and has minimum power and space requirements.

In accordance with the present invention, the radio-frequency gating apparatus employs two complementary switching transistors; one transistor designated as the "series transistor" is connected in series with a radio-frequency load and the remaining transistor designated as the "shunt transistor" is connected in parallel with the radio-frequency load. When the gate is "on" the series transistor is saturated and the shunt transistor is cut off, causing signal attenuation to be small. On the other hand, when the gate is "off," the series transistor is cut off and the shunt transistor is saturated, causing very high attenuation of the signal. The aforementioned complementary action of the series and shunt transistors is achieved by applying the gating voltage to the respective bases of both transistors through suitable resistors and with the respective emitters and collectors thereof suitably biased to achieve the desired results.

The above-mentioned and other features and objects of this invention and the manner of obtaining them will become more apparent by reference to the following description taken in conjunction with the accompanying drawings, wherein.

Figure 1:
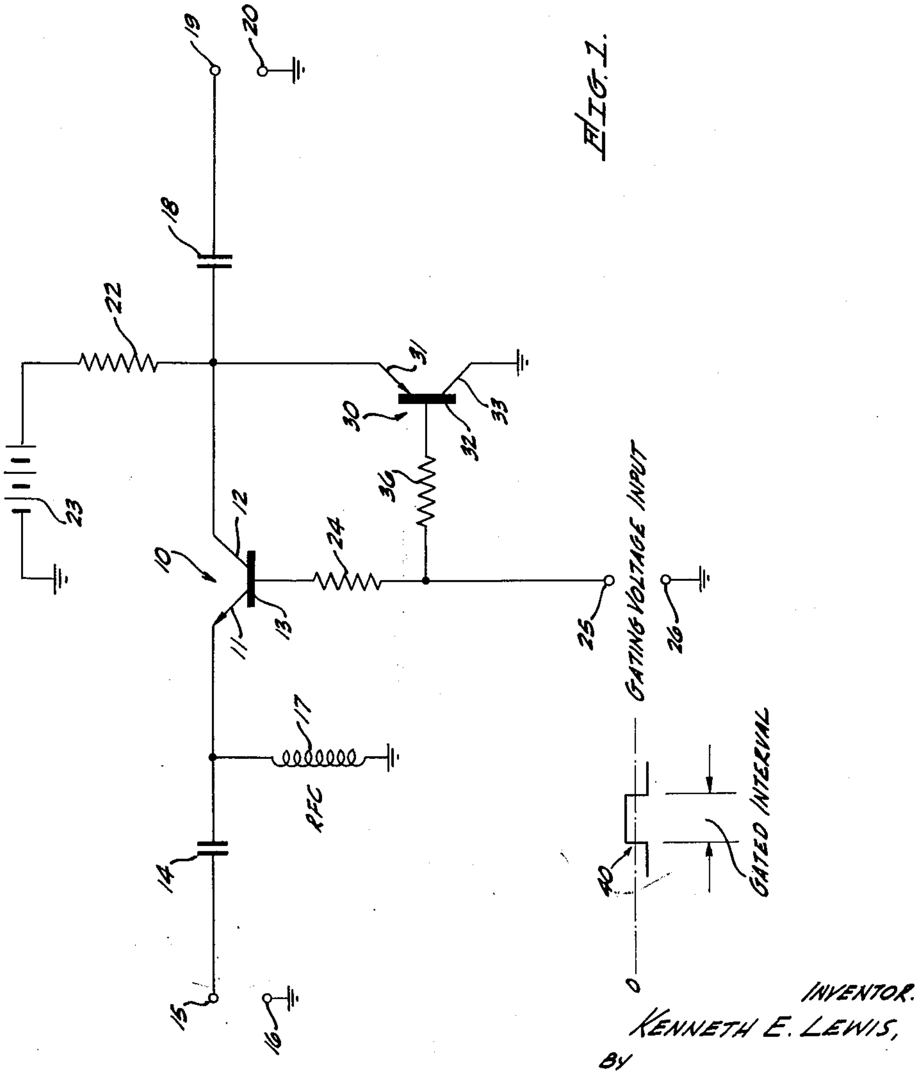
FIG. 1 shows a schematic circuit diagram of a preferred embodiment of the present invention.

Referring now to FIG. 1 of the drawings, a preferred embodiment of the transistor gating apparatus of the present invention includes a series transistor 10 of the n-p-n type having an emitter 11, a collector 12 and a base 13. The emitter 11 of transistor 10 is connected through a capacitor 14 to terminal 15 of terminals 15, 16, terminal 16 being connected to ground. In addition, the emitter 11 is maintained at quiescent ground potential by means of a connection therefrom through a radio-frequency choke 17 to ground. Further, the collector 12 of transistor 10 is connected through a capacitor 18 to a terminal 19 of terminals 19, 20, the terminal 20 being connected to ground. In addition, the collector 12 is maintained at a positive potential relative to ground by means of a connection through a resistor 22 to the positive terminal of a battery 23, the negative terminal of which is connected to ground. Lastly, the base 13 of transistor 10 is connected through a resistor 24 to terminal 25 of gating input terminals 25, 26, terminal 26 of which is connected to ground.

In addition to the above, the gating apparatus includes a p-n-p type shunt transistor 30 having an emitter 31, a base 32 and a collector 33, the latter of which is connected to ground. The emitter 31 of transistor 30 is connected directly to the collector 12 of transistor 10 and the base 32 of transistor 30 is connected through a resistor 36 to the terminal 25 of gating voltage input terminals 25, 26.

In operation, the radio-frequency source may be applied either across terminals 15, 16 or across terminals 19, 20. The choice of whether a "shunt-series" or a "series-shunt" connection is used is determined by the impedance of the radio-frequency source and the desired output impedance of the disclosed gating apparatus in the "off" state. In particular, a gating voltage waveform 40 is applied across gating voltage input terminals 25, 26. The gating voltage waveform 40 is positive with respect to ground throughout the interval to be gated and negative with respect to ground at all other times. The radio frequency choke 17 maintains the emitter 11 of transistor 10 at quiescent ground potential and the collector 33 of transistor 30 is connected directly to ground. Thus during intervals when the apparatus is in the "off" state, the voltage waveform 40 is negative with respect to ground thereby maintaining base 13 of n-p-n type transistor 10 negative with respect to emitter 11 to the extent that current flow through transistor 10 is cut off. Collector 33 of p-n-p type transistor 30, on the other hand, is positive with respect to the base 32 thereby allowing current to flow therethrough to the extent that transistor 30 is saturated. Thus under these conditions, transistor 10 presents a very high impedance between the terminals 15—19 and transistor 30 presents a low impedance from terminal 19 to ground.

During the gated interval, on the other hand, the voltage waveform 40 is slightly positive with respect to ground. This positive voltage is applied to the base 13 of transistor 10 making it positive with respect to the potential of emitter 11 to the extent that transistor 10 saturates and presents a very low series impedance between the terminals 15 and 19. The positive potential of voltage waveform 40 is also applied through resistor 36 to base 32 of transistor 30 making the base 32 positive relative to the collector 33 to the extent that current flow through transistor 30 is cut off thus presenting a very high shunt impedance to the signal.

The "on" insertion loss of the disclosed gating apparatus is inherently low because of the low saturation resistance of avaliable transistors. The "off" insertion loss, on the other hand, is a function of the emitter-collector capacitance of the series transistor 10, the frequency of the signal being gated and the saturation resistance of the shunt transistor 30. In a device wherein a type 2N167 transistor was employed for series transistor 10 and a type 2N123 transistor was employed for shunt transistor 30, over 60 decibels isolation was achieved with a 5 megacycle signal. In actual operation, care must be taken that the emitter-base voltage rating of the respective transistors during cut-off is not exceeded. It is considered within the scope of the teachings of the present case to employ protective diodes if required to prevent exceeding the emitter-base voltage rating of the respective transistors.

Figure 2:
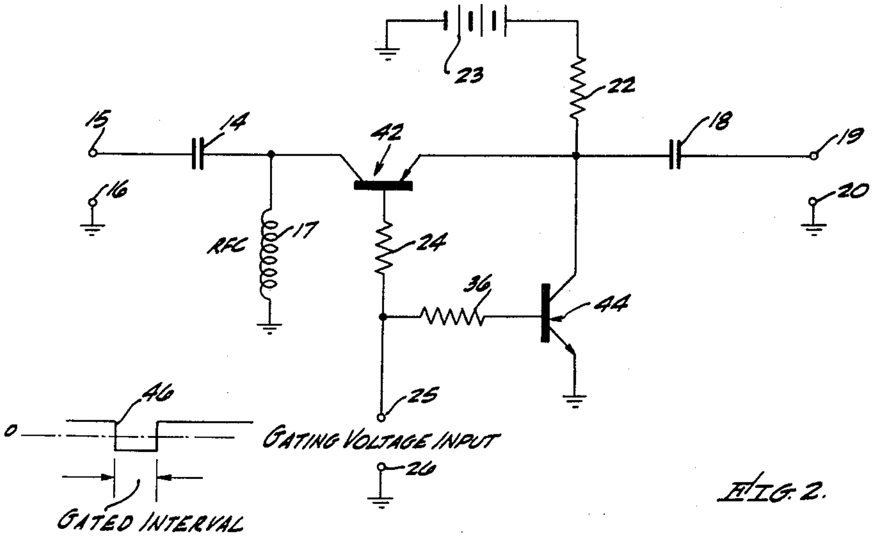
FIGS. 2, 3 and 4 show schematic circuit diagrams of alternate embodiments of the apparatus of FIG. 1.

In general, in the device of the present invention, if a n-p-n type transistor is employed for the series transistor 10, then the opposite type, i.e., a p-n-p type transistor, is employed for the shunt transistor 30. Referring to FIG. 2, there is illustrated a schematic circuit diagram wherein a p-n-p type transistor 42 is employed for the series transistor and a n-p-n type transistor 44 for the shunt transistor. Except for interchanging the connections to the collector and emitter leads of transistors 42, 44, the remaining portions of the circuit remain the same as described in connection with FIG. 1. In operation, however, a gating voltage waveform 46 is employed which has a negative pedestal during the gated interval and is positive with respect to ground at all other times.

In addition to the foregoing, it is also possible to employ a negative voltage source 48 in lieu of the battery 23. When this is the case, it is only necessary to reverse the connections to the collector and emitter of the transistors 10, 30 or transistors 42, 44 of the gating apparatus described in connection with FIGS. 1 and 2, respectively.

Figure 3:
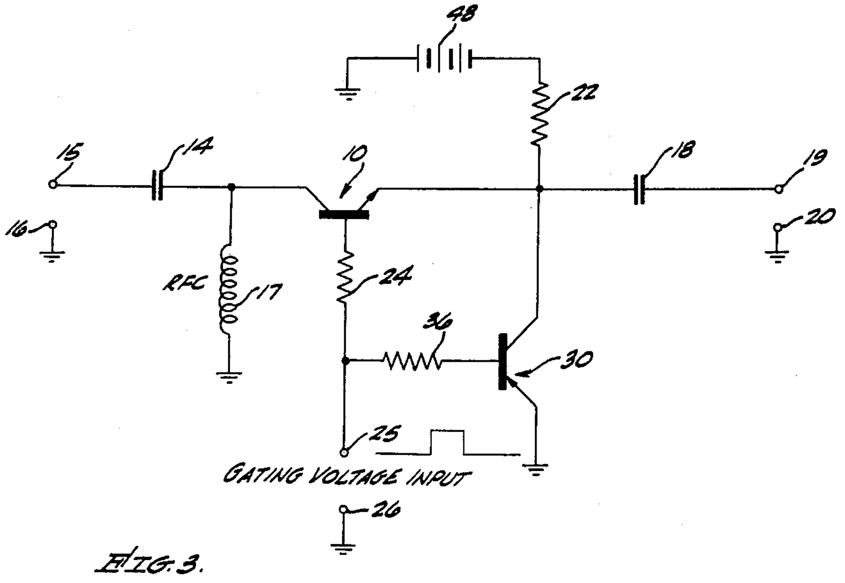
Figure 4:
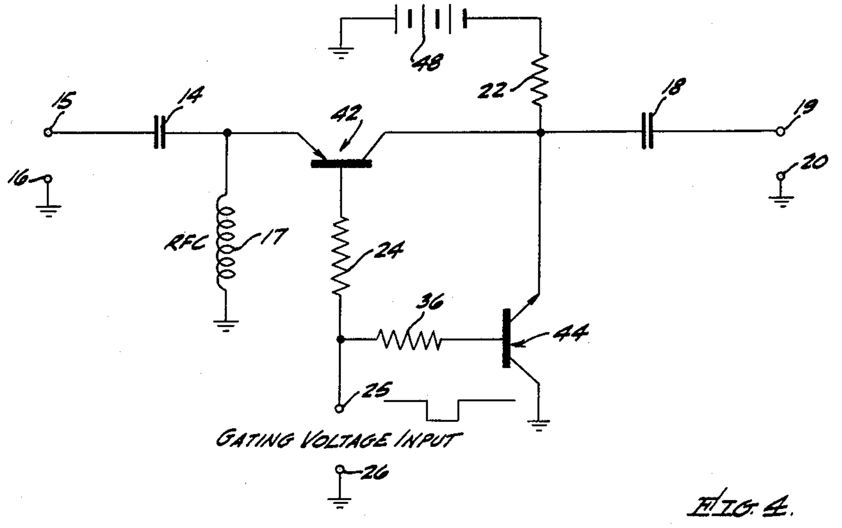

Referring to FIGS. 3 and 4, there is shown schematic circuit diagrams of the gating apparatus of FIGS. 1 and 2, respectively, wherein this has been effected. The general principle of the operation remains the same, the essential requisite being that the transistors 10, 30 be of alternate types.

Figure 5:
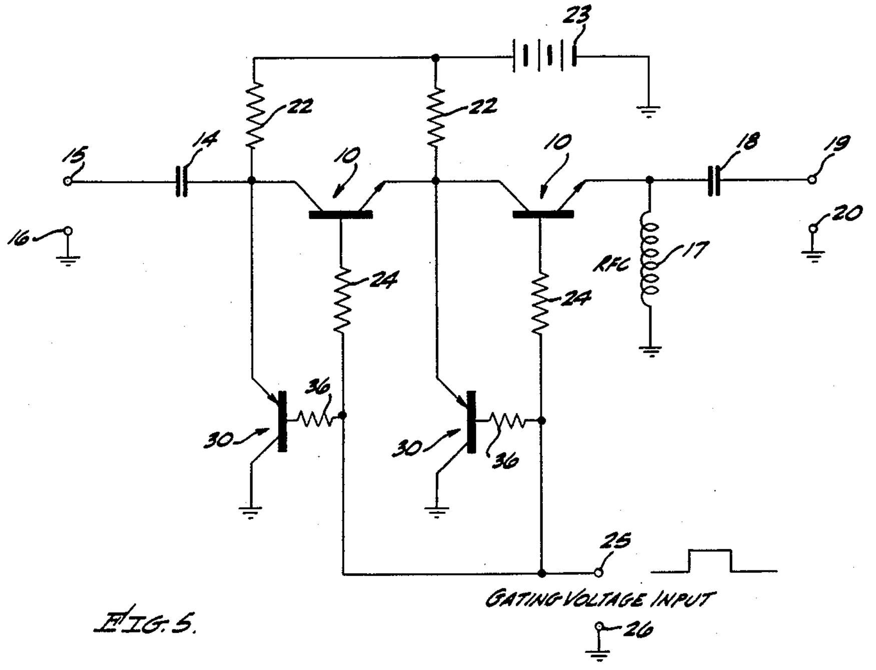
FIG. 5 illustrates two of the shunt-series stages of FIG. 3 directly-coupled and connected in cascade.

In addition to the foregoing, the individual stages of the present invention may be connected in cascade if more attenuation of the "off" state is required. Referring to FIG. 5, there is shown two networks of the type described in connection with FIG. 1 connected in cascade. In addition any of the aforementioned stages described in connection with FIGS. 2, 3 or 4 may be direct-coupled if the flow of direct-currents is the same. As shown in FIG. 5, two of the circuits described in connection with FIG. 1 are connected in cascade with the terminals 19, 20 employed as input terminals and terminals 15, 16 employed as output terminals.

Although the invention has been shown in connection with a certain specific embodiment, it will be readily apparent to those skilled in the art that various changes in form and arrangement of parts may be made to suit requirements without departing from the spirit and scope of the invention.

What is claimed is:

1. An electronic gating apparatus comprising first and second pairs of terminals, one terminal of each of said first and second pairs of terminals being maintained at a substantially fixed potential relative to a reference potential; first and second transistors each having a collector, an emitter and a base, said first transistor being one of the types p-n-p and n-p-n and said second transistor being the remainder of said types; means for coupling said emitter and said collector of said first transistor between the remaining ones of said first and second pairs of terminals; means for coupling said emitter and said collector of said second transistor between one pair of said first and second pairs of terminals; and means coupled to the respective bases of said first and second transistors for cutting off current flow through one of said first and second transistors and for simultaneously rendering the remaining one of said transistors saturated or for cutting off the flow of current through said remaining one of said transistors and for simultaneously rendering said one of said first and second transistors saturated thereby to selectively couple said first pair of terminals to said second pair of terminals.

2. An electronic gating apparatus comprising first and second pairs of terminals, one terminal of each of said first and second pairs of terminals being maintained at a substantially fixed potential relative to a reference potential; an n-p-n type transistor having an emitter, a collector and a base, said emitter being coupled to the remaining one of said first pair of terminals and said collector being coupled to the remaining one of said second pair of terminals; means coupled to said emitter of said n-p-n type transistor for maintaining said emitter at a quiescent potential substantially equal to said reference potential; means connected to said collector of said n-p-n type transistor for maintaining said collector at a potential that is positive relative to said reference potential; a p-n-p type transistor having an emitter, a collector and a base, said collector being maintained at said reference potential and said emitter being connected to said collector of said n-p-n type transistor; and means connected to the bases of said n-p-n type transistor and said p-n-p type transistor for applying a voltage thereto that is positive relative to said reference potential, thereby to render said n-p-n type transistor saturated and to cut off current flow through said p-n-p type transistor or for applying a potential thereto that is negative relative to said reference potential, thereby to render said n-p-n type transistor non-conductive and to saturate said p-n-p type transistor.

3. An electronic gating apparatus comprising first and second pairs of terminals, one terminal of each of said first and second pairs of terminals being maintained at a substantially fixed potential relative to a reference potential; an n-p-n type transistor having an emitter, a collector and a base, said collector being coupled to the remaining one of said first pair of terminals and said emitter being coupled to the remaining one of said second pair of terminals; means coupled to said collector of said n-p-n type transistor for maintaining said collector at a quiescent potential substantially equal to said reference potential; means connected to said emitter of said n-p-n type transistor for maintaining said emitter at a potential that is negative relative to said reference potential; a p-n-p type transistor having an emitter, a collector and a base, said emitter being maintained at said reference potential and said collector being connected to said emitter of said n-p-n type transistor; and means connected to the bases of said n-p-n type transistor and said p-n-p type transistor for applying a voltage thereto that is positive relative to said reference potential thereby to render said n-p-n type transistor saturated and to cut off current flow through said p-n-p type transistor or for applying a potential thereto that is negative relative to said reference potential thereby to cut off current flow through said n-p-n type transistor and to simultaneously saturate said p-n-p type transistor.

4. An electronic gating apparatus comprising first and second pairs of terminals, one terminal of each of said first and second pairs of terminals being maintained at a substantially fixed potential relative to a reference potential; a p-n-p type transistor having an emitter, a collector and base, said emitter being coupled to the remaining one of said first pair of terminals and said collector being coupled to the remaining one of said second pair of terminals; means coupled to said emitter of said p-n-p type transistor for maintaining said emitter at a quiescent potential substantially equal to said reference potential; means connected to said collector of said p-n-p type transistor for maintaining said collector at a potential that is negative relative to said reference potential; an n-p-n type transistor having an emitter, a collector and a base, said collector being maintained at said reference potential and said emitter being connected to said collector of said p-n-p type transistor; and means connected to the bases of said p-n-p type transistor and said n-p-n type transistor for simultaneously applying a voltage thereto that is negative relative to said reference potential thereby to cut off curernt flow through said n-p-n type transistor and to simultaneously render said p-n-p type transistor saturated or for applying a potential thereto that is positive relative to said reference potential thereby to render said n-p-n type transistor saturated and to simultaneously cut off current flow through said p-n-p type transistor.

5. An electronic gating apparatus comprising first and second pairs of terminals, one terminal of each of said first and second pairs of terminals being maintained at a substantially fixed potential relative to a reference potential; a p-n-p type transistor having an emitter, a collector and a base, said collector being coupled to the remaining one of said first pair of terminals and said emitter being coupled to the remaining one of said second pair of terminals; means coupled to said collector of said p-n-p type transistor for maintaining said collector at a quiescent potential substantially equal to said reference potential; means connected to said emitter of said p-n-p type transistor for maintaining said emitter at a potential that is positive relative to the said reference potential; an n-p-n type transistor having an emitter, a collector and a base, said emitter being maintained at said reference potential and said collector being connected to said emitter of said p-n-p type transistor; and means connected to the bases of said p-n-p type transistor and said n-p-n type transistor for simultaneously applying a voltage thereto that is negative relative to said reference potential thereby to render said p-n-p type transistor saturated and to cut off current flow through said n-p-n type transistor or for applying a voltage thereto that is positive relative to said reference potential thereby to cut off current flow through said p-n-p type transistor and to render said n-p-n type transistor saturated.

References Cited in the file of this patent

UNITED STATES PATENTS

| | | |
|---|---|---|
| 2,790,088 | Shive | Apr. 23, 1957 |
| 2,956,175 | Bothwell | Oct. 11, 1960 |
| 3,018,385 | O'Berry | Jan. 23, 1962 |

OTHER REFERENCES

Bright: "Junction Transistors Used as Switches," A.I.E.E. Transactions, vol. 74, No. 1, March 1955, pages 111 to 121.